United States Patent
Shimizu et al.

(10) Patent No.: US 7,042,384 B2
(45) Date of Patent: May 9, 2006

(54) DIFFERENTIAL AMPLIFIER DEVICE, 2-STAGE AMPLIFIER DEVICE, AND ANALOG/DIGITAL CONVERTER DEVICE

(75) Inventors: Yasuhide Shimizu, Nagasaki (JP);
Shigemitsu Murayama, Nagasaki (JP);
Kohhei Kudoh, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/106,958

(22) Filed: Apr. 15, 2005

(65) Prior Publication Data

US 2005/0248479 A1    Nov. 10, 2005

(30) Foreign Application Priority Data

Apr. 21, 2004   (JP)   ............................ P2004-126073
Feb. 8, 2005    (JP)   ............................ P2005-032300

(51) Int. Cl.
*H03M 1/12*   (2006.01)

(52) U.S. Cl. ........................................ 341/156; 341/155
(58) Field of Classification Search ................. 341/156
See application file for complete search history.

(56) References Cited

U.S. PATENT DOCUMENTS 5,600,451 A * 2/1997 Maki .......................... 358/483
6,530,068 B1 * 3/2003 Cao et al. ....................... 716/8
6,542,722 B1 * 4/2003 Sorrells et al. ............. 455/110
6,750,704 B1   6/2004 Connell et al.
6,812,786 B1 * 11/2004 Jackson et al. ............... 330/51
6,963,233 B1 * 11/2005 Puccio et al. ............... 327/157

FOREIGN PATENT DOCUMENTS

EP          0 743 747      11/1996
WO       WO 03/103141      12/2003

* cited by examiner

*Primary Examiner*—Peguy JeanPierre
*Assistant Examiner*—Joseph Lauture
(74) *Attorney, Agent, or Firm*—Sonnenschein Nath & Rosenthal LLP

(57) ABSTRACT

A differential amplifier device is disclosed wherein the device comprises a differential amplifier circuit, a load circuit connected to the differential amplifier circuit; and a change-over switch connected to the load circuit for changing a gain of the differential amplifier circuit by switching between a full load where a whole of the load circuit is set to be the load of the differential amplifier circuit and a partial load where a part of the load circuit is set to be the load of the differential amplifier circuit, wherein the load circuit is configured to amplify an input signal and an output signal of the differential amplifier circuit in the full load.

16 Claims, 10 Drawing Sheets

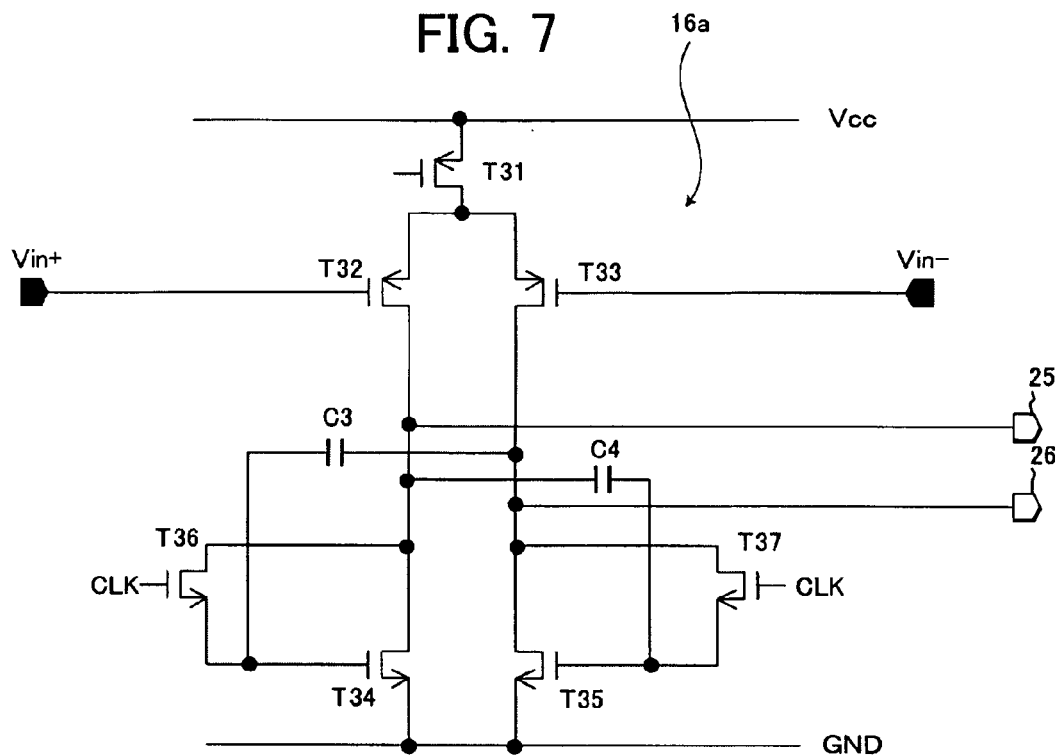
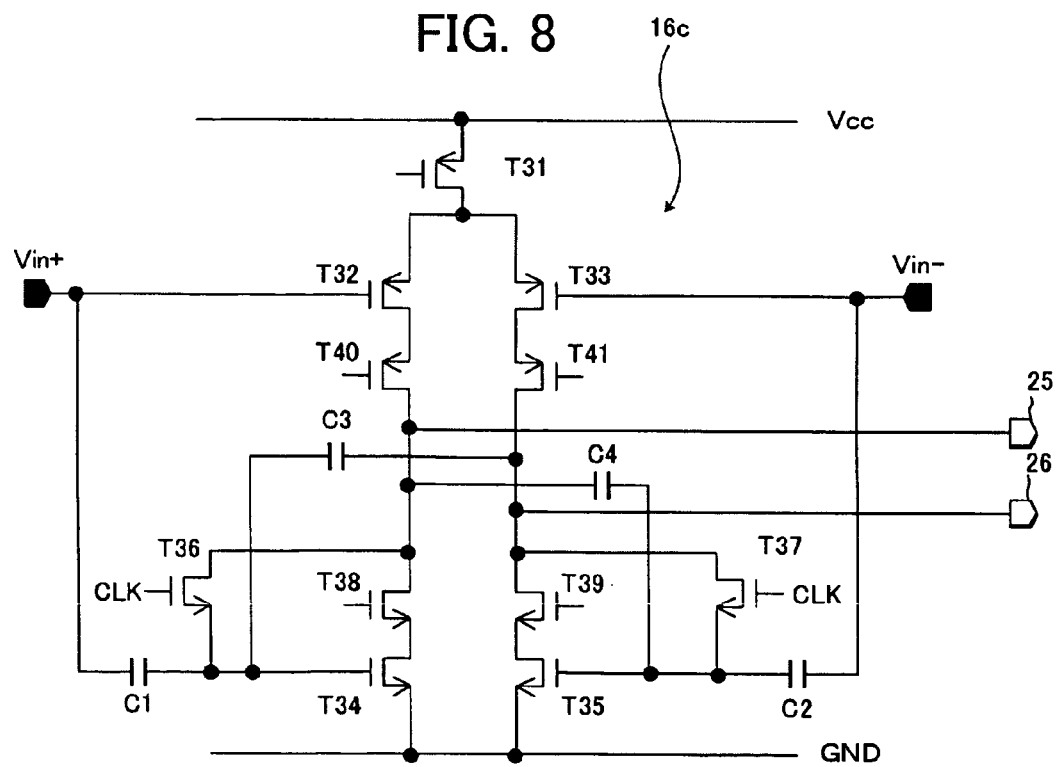

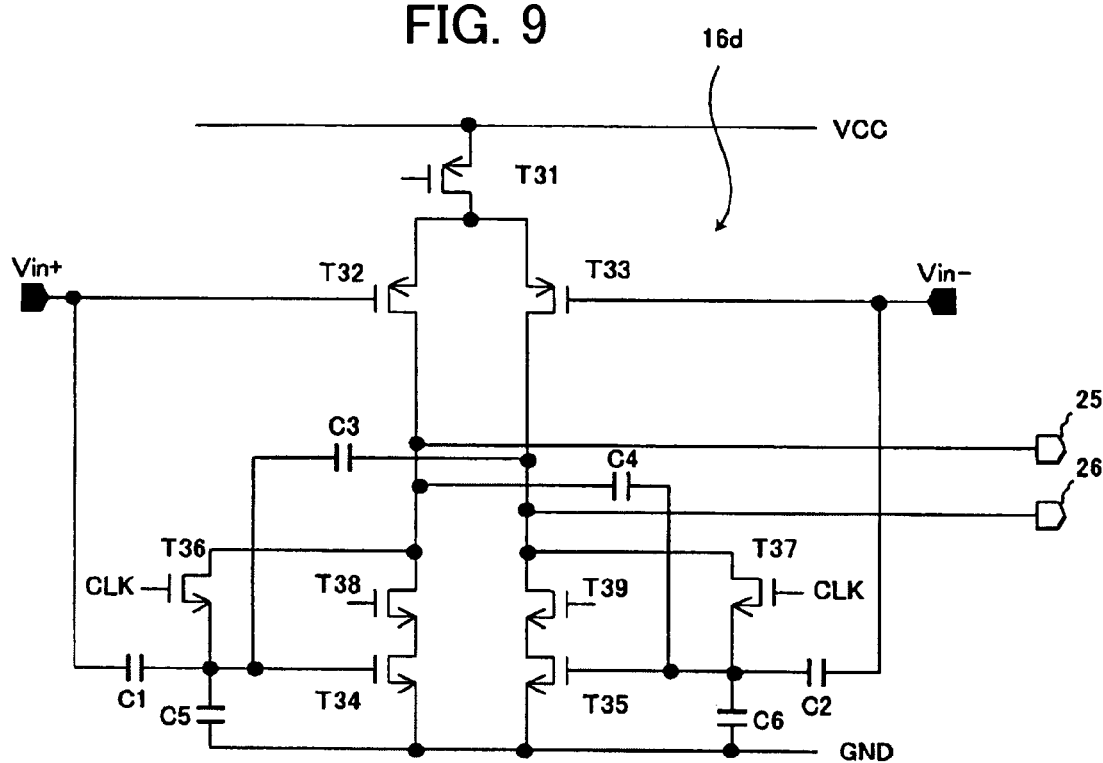
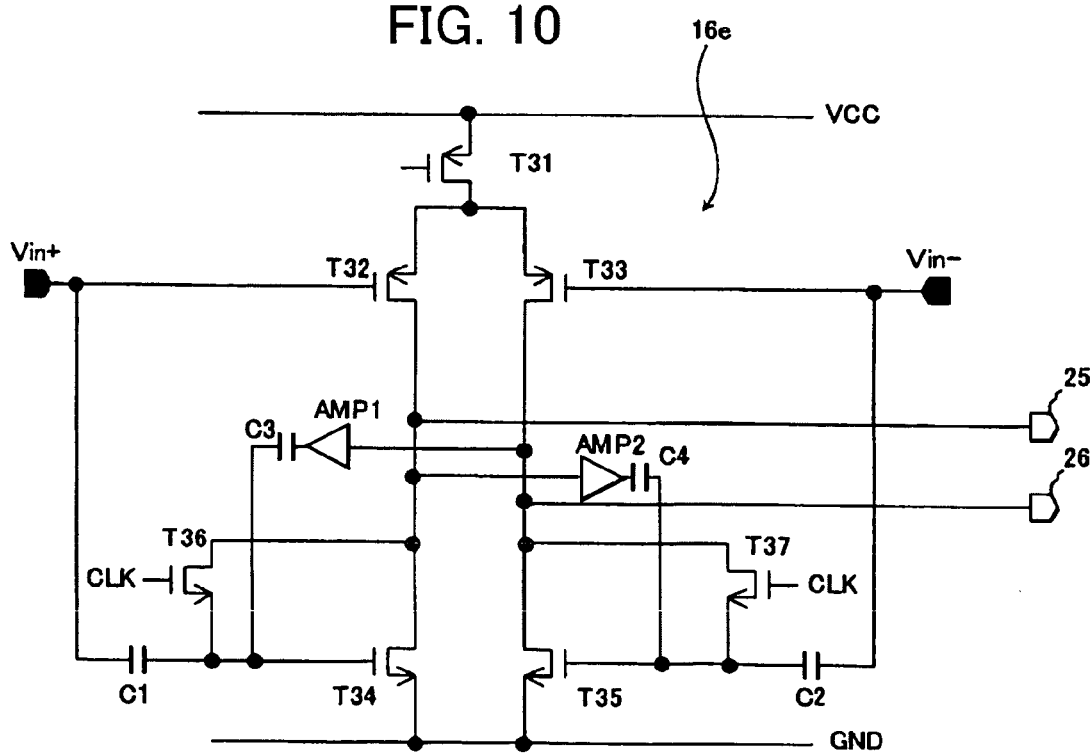

DIFFERENTIAL AMPLIFIER DEVICE, 2-STAGE AMPLIFIER DEVICE, AND ANALOG/DIGITAL CONVERTER DEVICE

CROSS REFERENCES TO RELATED APPLICATIONS

The present invention contains subject matter related to Japanese Patent Application JP 2004-126073 filed on Apr. 21, 2004, and Japanese Patent Application JP 2005-032300 filed on Feb. 8, 2005 in the Japanese Patent Office, the entire contents of which being incorporated herein by reference.

BACKGROUND OF THE INVENTION

1. Field of the Invention

The present invention relates to a differential amplifier device, a 2-stage amplifier device, and an analog/digital converter device.

2. Description of Related Art

Recent years, an analog/digital converter device for converting an analog signal to a digital signal has been wildly adopted along with the progress of digital devices.

In this analog/digital converter device, an analog signal is converted to a digital signal by comparing an inputted analog signal with plural steps of reference voltages, so that a plurality of amplifier devices are employed.

Accordingly in the analog/digital converter device, it is considered to use amplifier devices having good quality, and particularly, a 2-stage amplifier device having offset compressing function is employed in order to reduce an offset voltage which is important as a quality of an amplifier device.

This 2-stage amplifier device is configured by connecting a variable gain differential amplifier device to a fixed gain differential amplifier device in series, and is set to apparently reduce the offset voltage of the differential amplifier device in the previous stage by increasing or decreasing the gain of the differential amplifier device in the subsequent stage.

There has been proposed a differential amplifier device such as disclosed in FIG. 16 as a differential amplifier device 101 employed in the subsequent stage, in which a load circuit 103 is connected to a differential amplifier circuit 102, and a change-over switch 104 is connected to the load circuit 103, and it becomes able to perform increasing or decreasing of the gain of the differential amplifier circuit 102 by switching between the full load where a whole of the load circuit 103 is set to be the load of the differential amplifier circuit 102 and the partial load where a part of the load circuit 103 is set to be the load of the differential amplifier circuit 102 with the change-over switch 104.

In the differential amplifier device 101, the differential amplifier circuit 102 is configured by differentially connecting P-channel type transistors T102, T103 to a P-channel type transistor T101, and further the load circuit 103 is configured with N-channel type transistors T104, T105 connected to the differential amplifier circuit 102. In addition, switching transistors T106, T107 are connected between a drain terminal and a gate terminal of the N-channel type transistors T104, T105 configuring the load circuit 103 as a change-over switch 104. Further, each of condensers C1, C2 is connected between gate terminals of the transistors T104, T105 and the ground GND, respectively.

When the switching transistors T106, T107 are set to an off state, a whole of the load circuit 103 becomes a load (full load) in the differential amplifier device 101. In this case, the load circuit 103 becomes a current source type load by the transistors T104, T105, and increases an output impedance, so that the gain of the differential amplifier device 101 also increases. On the contrary, when the switching transistors T106, T107 are set to an on state, a part of the load circuit 103 becomes a load (partial load) in the differential amplifier device 101. In this case, the load circuit 103 becomes a diode-type load by the transistors T104, T105, and decreases an output impedance, so that the gain of the differential amplifier device 101 also decreases.

Further if the offset voltage of the amplifier circuit connected to the previous stage side of the differential amplifier device 101 is Vos, the gain in the partial load is Gr, the gain in the full load is Gc, and the input voltage is Vin, then the output voltage Vout in the partial load is designated as Vout=Gr×Vos, and the output voltage Vout in the full load is designated as Vout=Gc×Vin, so that when it is changed from the partial load to the full load, an equation Gr×Vos=Gc×Vin is establised, and accordingly, the input voltage Vin is to be designated as Vin=Vos×Gr/Gc.

That is, in the 2-stage amplifier device employing differential amplifier device 101 as described above, the offset voltage is compressed by Gr/Gc, and the input conversion offset is to be designated as Vos×Gr/Gc.

In this case, a trans-conductance of the transistors T102, T103 configuring the differential amplifier circuit 102 is gm1, a trans-conductance of the transistors T104, T105 configuring the load circuit 103 is gm2, a load capacitance is C, and an operation time is t, then the gain Gr in the partial load is designated as Gr=gm1/gm2, and the gain Gc in the full load is designated as Gc=gm1/C×t, so that the input conversion offset is to be designated as Vin=Vos×C/(gm2×t).

Accordingly, in the differential amplifier device 101 having above-mentioned configuration, in order to further reduce the input conversion offset, it is only necessary to make the load capacitance C smaller, or to make the trans-conductance gm2 and the operation time t of the transistors T104, T105 larger.

Patent Document: Japanese Laid-Open Patent Application OPH3-70382

SUMMARY OF THE INVENTION

In the differential amplifier device 101 as configured as above, the load capacitance C and the operation time t are restricted based on its circuit configuration and specification, so that it was necessary to set the trans-conductance g m2 of the transistors T104, T105 larger in order to further reduce the input conversion offset of the differential amplifier device 101.

However, in order to increase the trans-conductance gm2 of the transistors T104, T105, it was necessary to make larger the transistors T104, T105 in size or to flow larger current through the transistors T104, T105. When the sizes of the transistors T104, T105 were made larger, parasitic capacitances of the transistors T104, T105 were increased, so that the operation speed of the differential amplifier device 101 was likely to be down, and on the contrary, when the large current flew through the transistors T104, T105, the power consumption of the differential amplifier device 101 was likely to be increased.

According to one embodiment of the present invention, a load circuit is connected to a differential amplifier circuit, and a change-over switch is connected to the load circuit, and thereby a differential amplifier device is configured to change the gain of the differential amplifier circuit by switching with the change-over switch between a full load where a whole of the load circuit is set to be a load of the differential amplifier circuit and a partial load where a part of the load circuit is set to be a load of the differential amplifier circuit, wherein the load circuit is configured to amplify the input signal and the output signal of the differential amplifier circuit in the fill load.

Further, in another embodiment of the present invention, the output signal of the differential amplifier circuit is inputted to the load circuit through a condenser.

Further, in another embodiment of the present invention, the input signal of the differential amplifier circuit is inputted to the load circuit through a condenser.

Further, in further another embodiment of the present invention, in a 2-stage amplifier device wherein at least two differential amplifier devices are connected in series, and the 2-stage amplifier device has an offset compressing function for compressing the offset voltage by increasing or decreasing a gain of a differential amplifier device in the subsequent stage. Further, a load circuit is connected to the differential amplifier device in the subsequent stage, and a change-over switch is connected to the load circuit, so that it is configured to change a gain of the differential amplifier circuit by switching with the change-over switch between a full load where a whole of the load circuit is set to be a load of the differential amplifier circuit and a partial load where a part of the load circuit is set to be a load of the differential amplifier circuit, and further the load circuit is configured to amplify the input signal and the output signal of the differential amplifier circuit in the fill load.

Further in an analog/digital converter device of another embodiment of the present invention configured to amplify differences between an analog signal voltage and a plurality of reference voltages to convert into a digital signal, an amplifier circuit is configured with a differential amplifier device having an offset compressing function for compressing an offset voltage, and in the differential amplifier device, a load circuit is connected to the differential amplifier circuit, and a change-over switch is connected to the load circuit. The gain of the differential amplifier circuit is changed with this change-over switch by switching between a full load where a whole of the load circuit is set to be the load of the differential amplifier circuit and a partial load where a part of the load circuit is set to be the load of the differential amplifier circuit, and further, the load circuit is configured to amplify the input signal and the output signal of the differential amplifier circuit in the full load.

Accordingly, in the embodiment of the present invention, the load circuit is connected to the differential amplifier circuit, and the change-over switch is connected to the load circuit, so that the gain of the differential amplifier circuit is changed with this change-over switch by switching between the full load where the whole of the load circuit is set to be the load of the differential amplifier circuit and the partial load where a part of the load circuit is set to be the load of the differential amplifier circuit, and further, the load circuit is configured to amplify the input signal and the output signal of the differential amplifier circuit in the full load, and accordingly, it is possible to increase the gain of the differential amplifier device in the full load.

According to the embodiment of the present invention, it is possible to increase the gain ratio of the differential amplifier device without decreasing the operation speed and without increasing the power consumption in the differential amplifier device.

Accordingly, in case of configuring the 2-stage amplifier device having an offset compressing function using this differential amplifier device, it is possible to be the 2-stage amplifier device superior in the offset compressing function while reducing the input conversion offset.

Further, it is possible to improve the characteristic of the analog/digital converter device when the analog/digital converter device is configured to use this differential amplifier device.

Still further, if the input signal and the output signal of the differential amplifier circuit are inputted to the load circuit through a condenser, even in the partial load, the voltage is held in the condenser, and it is possible to hold a DC potential of an input portion of the load circuit load circuit.

BRIEF DESCRIPTION OF THE DRAWINGS

FIG. 7 is a circuit diagram of another differential amplifier circuit;

FIG. 8 is a circuit diagram of another differential amplifier circuit;

FIG. 9 is a circuit diagram of another differential amplifier circuit;

FIG. 10 is a circuit diagram of another differential amplifier circuit;

DESCRIPTION OF THE PREFERRED EMBODIMENTS

Hereinafter, one embodiment of an analog/digital converter device according to the present invention is described with reference to the attached drawings. In the description below, a sub-ranging type analog/digital converter device which totally converts an analog signal into a digital signal of 4 bits by converting the analog signal to upper 2 bits of the digital signal at first, and then converting the analog signal to lower 2 bits of the digital signal is described, but specific embodiment of the present invention is not limited to this.

Figure 1:
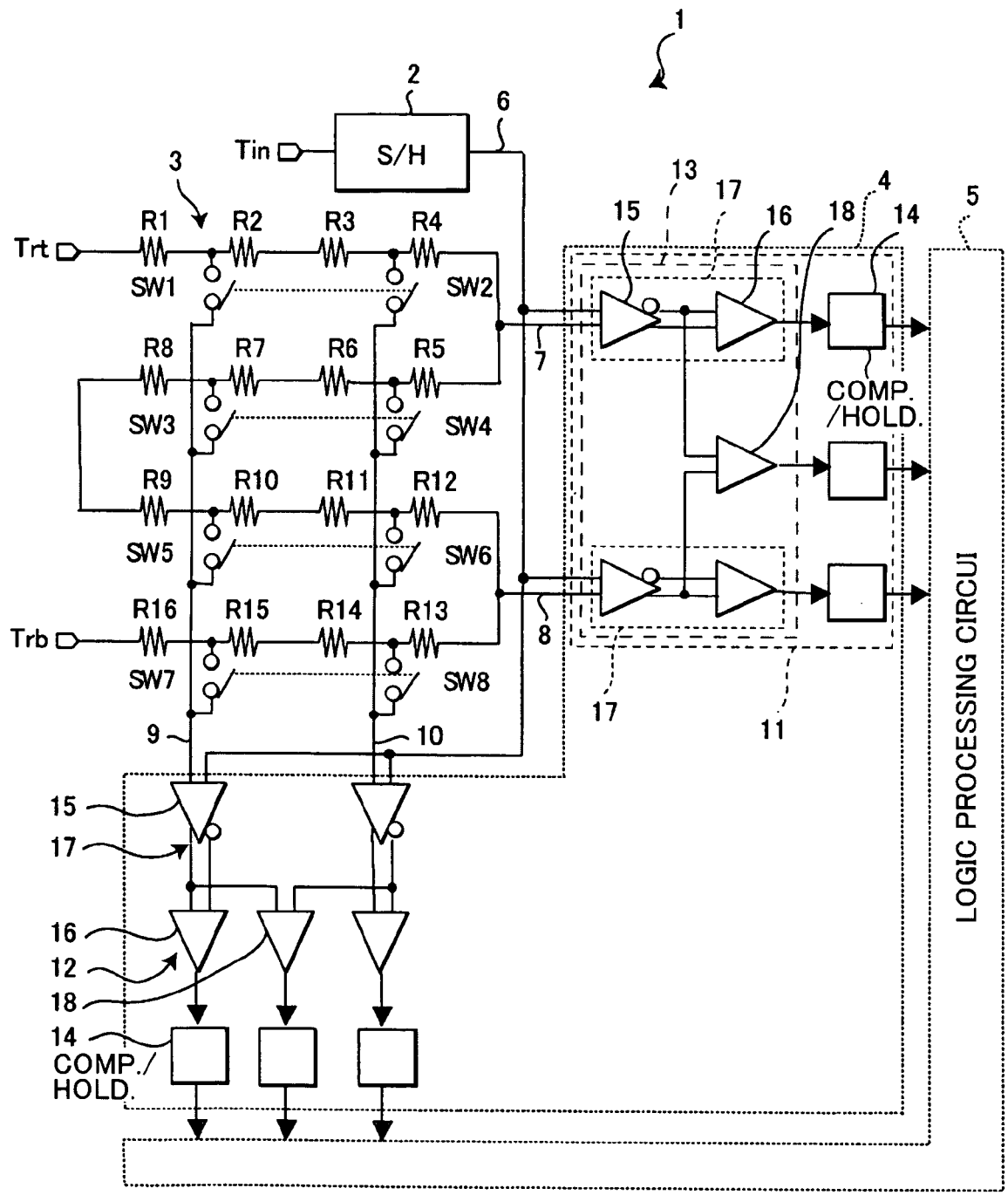
FIG. 1 is a circuit diagram for describing one embodiment of an analog/digital converter device according to the present invention.

An analog/digital converter device 1 according to one embodiment of the present invention is configured to include, as shown in FIG. 1, a sample and hold circuit 2 for sampling and holding an analog signal, a reference voltage generating circuit 3 for generating a plurality of different reference voltages, a comparing circuit 4 for comparing a voltage of the analog signal with the plurality of different reference voltages, and a logic processing circuit 5 for outputting a digital signal corresponding to the analog signal by logically processing an output of the comparing circuit 4.

The sample and hold circuit 2 holds, for a predetermined time and at a predetermined timing, the voltage of the analog signal applied to an input terminal Tin, and is to output to a hold signal line 6.

The reference voltage generating circuit 3 generates a plurality of reference voltages by dividing a voltage between a high voltage side reference voltage and a low voltage side reference voltage with 16 resistors R1 to R16 which have the same resistance value and are connected in series between the high voltage side power source terminal Trt supplying the high voltage side reference voltage and the low voltage side power source terminal Trb supplying the low voltage side reference voltage, and is configured to output a predetermined reference voltage from upper bit side reference voltage signal lines 7, 8 or from lower bit side reference voltage signal lines 9, 10.

Specifically, in the reference voltage generating circuit 3, the upper bit side reference voltage signal lines 7, 8 for outputting the upper bit side reference voltage between a forth resistor R4 and a fifth resistor R5 counted from the high voltage side power source terminal Trt, and between a forth resistor R13 and a fifth resistor R12 are connected, respectively, and in addition, the lower bit side reference voltage signal lines 9,10 for outputting the lower bit side reference voltage between a first resistor R1 and a second resistor R2 counted from the high voltage side power source terminal Trt and between a third resistor R3 and the resistor R4 are respectively connected by way of an interlocked switches SW 1, SW 2. In addition, these lower bit side reference voltage signal lines 9,10 are connected between a seventh resistor R7 and an eighth resistor R8 counted from the high voltage side power source terminal Trt and between a fifth resistor R5 and a sixth resistor R6 counted from the high voltage side power source terminal Trt by way of an interlocked switches SW 3, SW 4, connected between a ninth resistor R9 and a tenth resistor R10 counted from the high voltage side power source terminal Trt and between an eleventh resistor R11 and a twelfth resistor R12 counted from the high voltage side power source terminal Trt by way of an interlocked switches SW 5, SW 6, and in addition, further connected between a fifteenth resistor R15 and a sixteenth resistor R16 counted from the high voltage side power source terminal Trt and between an thirteenth resistor R13 and a fourteenth resistor R14 counted from the high voltage side power source terminal Trt by way of an interlocked switches SW 7, SW 8.

Further, in case of converting an analog signal into an upper bit side digital signal, the reference voltage generating circuit 3 sets all the switches SW1 to SW8 to be off state, and outputs a reference voltage from the upper bit side reference voltage signal lines 7, 8, and on the contrary in case of converting the analog signal into a lower bit side digital signal, the reference voltage generating circuit 3 sets only arbitrary one pair of switches SW1 to SW8, and outputs a reference voltage from the lower bit side reference voltage signal lines 9, 10.

The comparing circuit 4 is configured to include an upper bit comparing circuit 11 for comparing the voltage of the analog signal and the upper bit side reference voltage, and a lower bit comparing circuit 12 for comparing the voltage of the analog signal and the lower bit side reference voltage. In this case, the upper bit comparing circuit 11 and the lower bit comparing circuit 12 have the same configurations and accordingly, the description is given only to the upper bit comparing circuit 11 hereinafter.

The upper bit comparing circuit 11 is configured to include an amplifier circuit 13 for amplifying a difference between the voltage of the analog signal and the reference voltage, and a comparing and holding circuit 14 for comparing and holding output of the amplifier circuit 13.

In this case, the amplifier circuit 13 is configured with two 2-stage amplifier devices 17 to which two differential amplifier devices 15, 16 are connected in series, and a complementary amplifier circuit 18 for differentially amplifying outputs of the differential amplifier devices 15, 15 by being connected to the differential amplifier devices 15, 15 in the previous stage of the adjacent 2-stage amplifier devices 17, 17. In this case, each of the 2-stage amplifier devices 17, 17 is not only configured with a series connected two differential amplifier devices 15, 16, but also configured with a series connected three or more of the differential amplifier devices.

Figure 2:
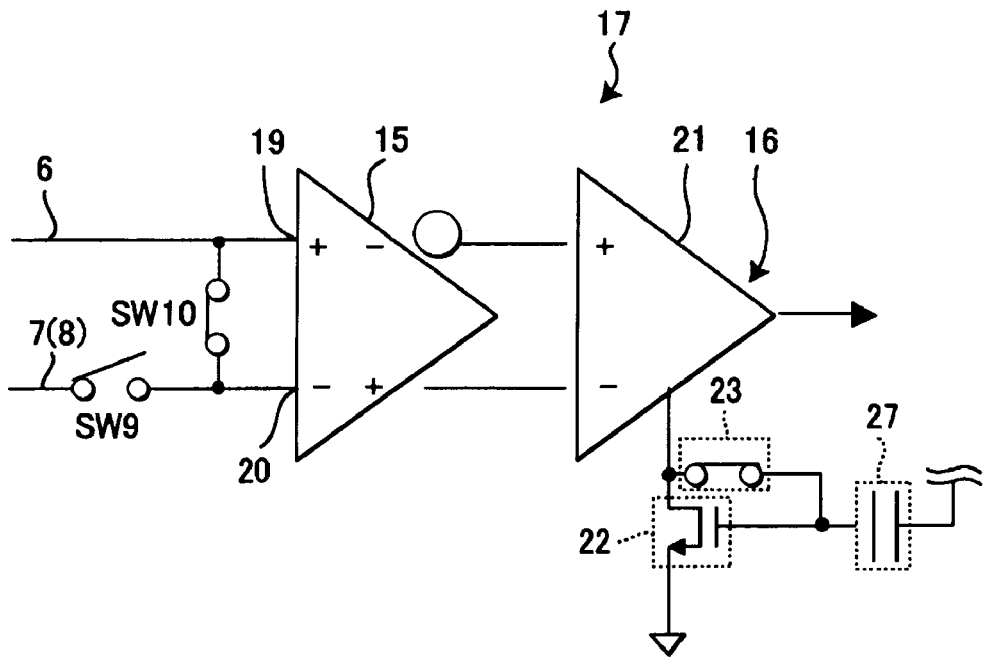
FIG. 2 is a schematic circuit diagram of an amplifier circuit (in a reset mode)
Figure 3:
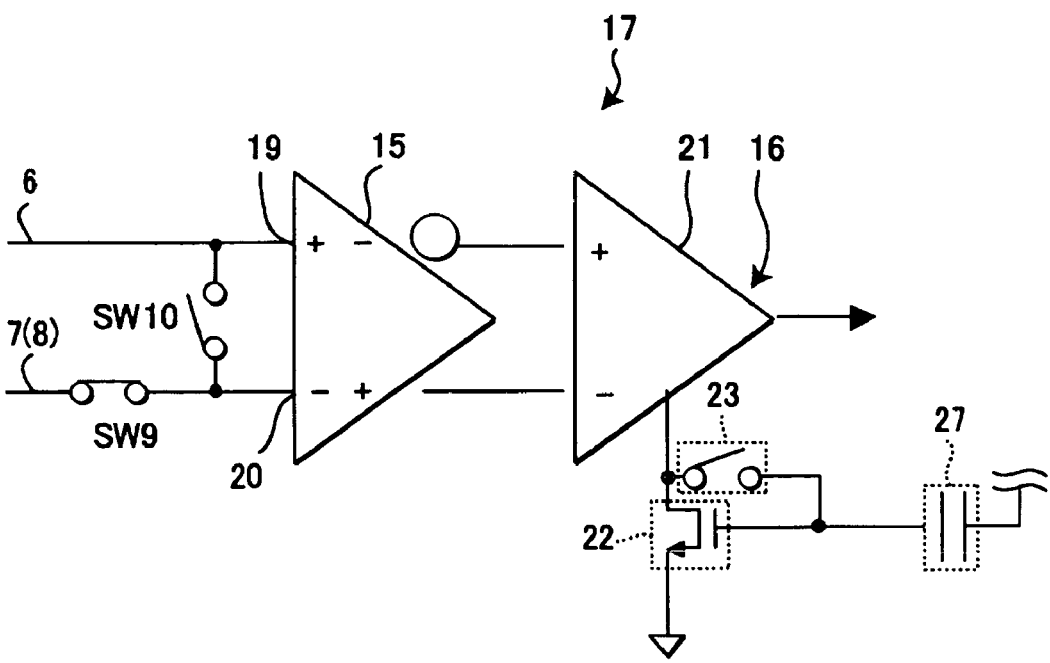
FIG. 3 is a schematic circuit diagram of the amplifier circuit (in a comparison mode)

Each of the 2-stage amplifier devices 17, 17 is, as schematically shown in FIG. 2 and FIG. 3, a variable gain differential amplifier device 16 is connected in the subsequent stage serially to a fixed gain differential amplifier device 15.

In the differential amplifier device 15 in the previous stage, a non-inverting input 19 is connected to a hold signal line 6, an inverting input 20 is connected to a lower bit side reference voltage signal line 7 (8) by way of a switch SW9, and these non-inverting input 19 and inverting input 20 are short-circuited by way of a switch SW 10. In this case, the switches SW9, SW10 are intermittently controlled by a clock signal CLK.

In the differential amplifier device 16 in the subsequent stage, a load circuit 22 is connected to a differential amplifier circuit 21, and a load switching circuit 23 is connected to the load circuit 22, thereby the differential amplifier device 16 is configured to perform increasing or decreasing of a gain of the differential amplifier circuit 21 by switching with the load switching circuit 23 between a full load where a whole of the load circuit 22 is set to be a load of the differential amplifier circuit 21 and a partial load where a part of the load circuit 22 is set to be a load of the differential amplifier circuit 21.

Further, the each 2-stage amplifier device 17 has an offset compressing function for apparently compressing an offset voltage of the differential amplifier device 15 in the previous stage by increasing or decreasing a gain of the differential amplifier device 16 in the subsequent stage with the load switching circuit 23.

Hereinafter, a specific configuration of each of the 2-stage amplifier devices 17, 17 is described with reference to FIG. 4.

The differential amplifier device 15 in the previous stage differentially connects a pair of N-channel type transistors T11, T12, and in these transistors T11, T12, gate terminals are connected to respective non-inverting input 19 and inverting input 20, current sources I1, I2 are connected between drain terminals and a power source VCC, and a current source I3 is connected between source terminals and the ground GND.

Further, in the differential amplifier device 15 in the previous stage, source terminals of the P-channel type transistors T21, T22 are respectively connected to drain terminals of the transistors T11, T12, a predetermined bias voltage Vb1 is supplied to the gate terminals of the transistors T11, T12, and outputs of the differential amplifier device 15 in the previous stage are derived from the drain terminals of the transistors T21, T22.

Between the differential amplifier device 15 in the previous stage and the differential amplifier device 16 in the subsequent stage, a limiter circuit 24 is provided for limiting output amplitudes of the differential amplifier device 15 in the previous stage.

The limiter circuit 24 is configured by connecting load resistors R21, R22 to the drain terminals of the transistors T21, T22, and by connecting a resistor R30 between the load resistors R21, R22 and the ground GND. In this case, the output amplitudes of the differential amplifier device 15 in the previous stage are limited by the load resistors R21, R22, and a DC operation point of the input signal for the differential amplifier device 16 in the subsequent stage is adjusted to an optimal voltage by the resistor R30.

Figure 4:
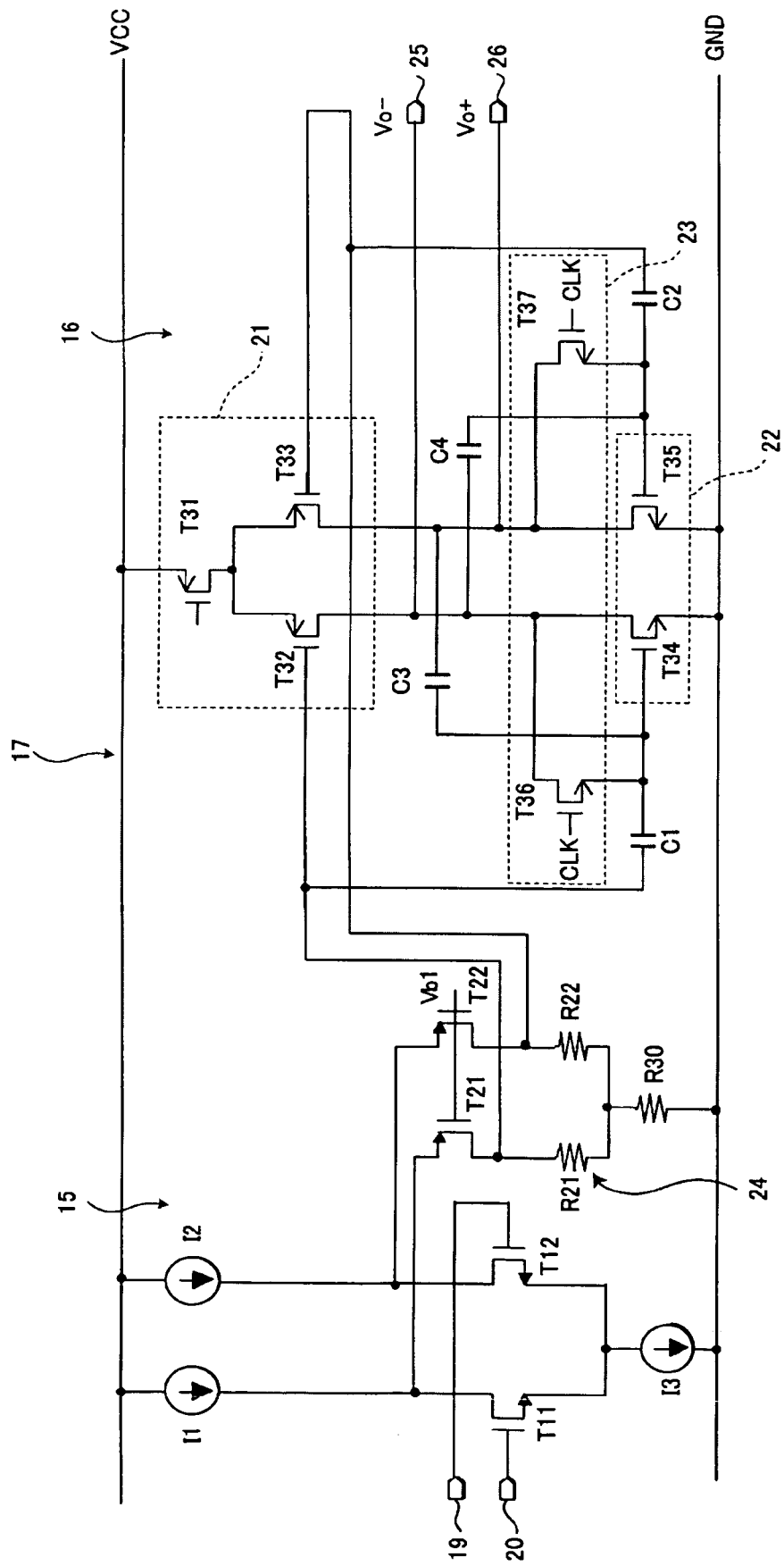
FIG. 4 is a circuit diagram of an amplifier circuit.
Figure 5:
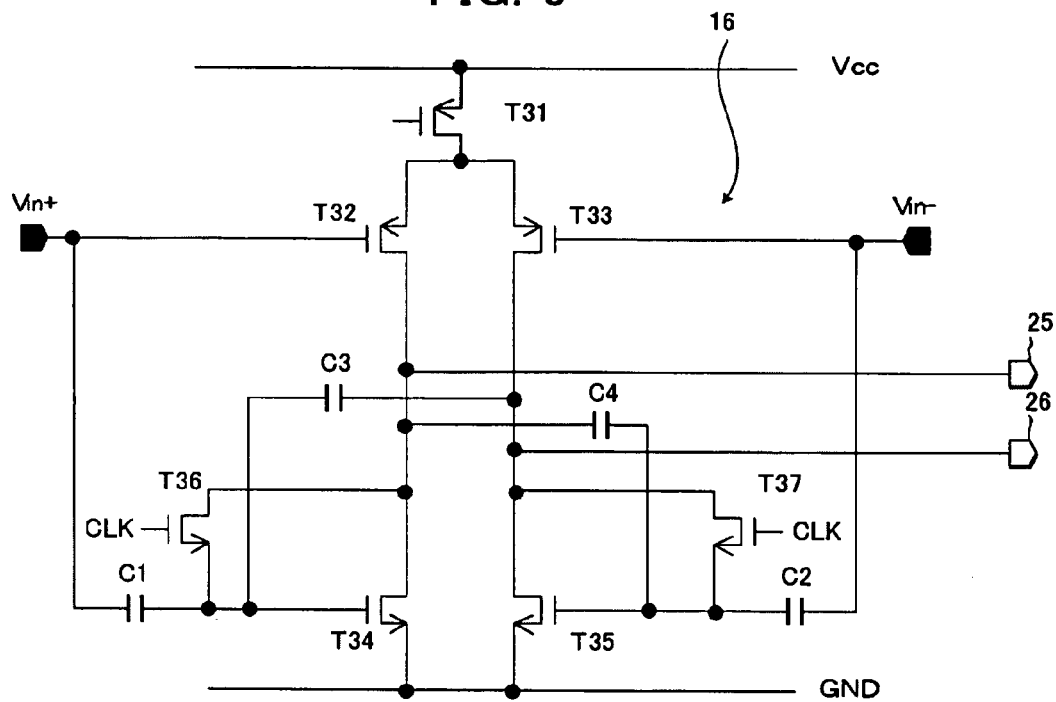
FIG. 5 is a circuit diagram of a differential amplifier circuit.

In the differential amplifier device 16 in the subsequent stage, a source terminal of a P-channel type transistor T31 is connected to a power source VCC as a current source as shown in FIG. 4 and FIG. 5, a differential amplifier circuit 21 is configured by connecting source terminals of P-channel type transistors T32, T33 forming a differential pair to a drain terminal of the transistor T31. Further, an output is derived by connecting drain terminals of the transistors T21, T22 connected to the outputs of the differential amplifier device 15 in the previous stage to gate terminals of the transistors T32, T33 in this differential amplifier circuit 21, and in addition, by connecting the inverting output terminal 25 and the non-inverting output terminal 26 to the drain terminals of the transistors T32, T33.

In this case, it is possible to perform DC cut by connecting condensers between the gate terminals of the transistors T32, T33, and the drain terminals of the transistors T21, T22. In this case, it is necessary to apply a voltage to be a predetermined DC operation point to the gate terminals of the transistors T32, T33.

Further, in the differential amplifier device 16 in the subsequent stage, drain terminals of transistors T34, T35 as a load circuit 22 are connected to the drain terminals of the transistors T32, T33 in the differential amplifier circuit 21, and the ground GND is connected to source terminals of the transistors T34, T35.

Further, in the differential amplifier device 16 in the subsequent stage, switching transistors T36, T37 as a switching circuit 23 are connected between the drain terminals and gate terminals of the transistors T34, T35 in the load circuit 22, and the clock signal CLK is supplied to the gate terminals of the switching transistors T36, T37.

Further, in the differential amplifier device 16 in the subsequent stage, condensers C1, C2, C3, C4 as a voltage hold circuit 27 for holding an input signal voltage of the differential amplifier circuit 21 are connected to gate terminals of the transistors T34, T35 in the load circuit 22. In addition, the gate terminals of the transistors T32, T33 which become input terminals of the differential amplifier circuit 21 are connected to condensers C1, C2, respectively, and the drain terminals of the transistors T32, T33 which become output terminals of the differential amplifier circuit 21 are connected to the condensers C3, C4, respectively.

In this case in the differential amplifier device 16 in the subsequent stage, when the switching transistors T36, T37 are set to an off state, a whole of the load circuit 22 becomes a load (full load), and at this time, the load circuit 22 becomes a current source type load by the transistors T34, T35, and increases an output impedance, so that the gain of the differential amplifier device 16 in the in the subsequent stage also increases. On the contrary, when the switching transistors T36, T37 are set to an on state, a part of the load circuit 22 becomes a load (partial load). In this case, the load circuit 22 becomes a diode-type load by the transistors T34, T35, and decreases an output impedance, so that the gain of the differential amplifier device 16 in the in the subsequent stage also decreases. However, a DC potential is held as the voltage is held in the condensers C1, C2, C3, C4 connected to the gate terminals of the transistors T34, T35.

Further, the input signal of the differential amplifier device 16 (differential amplifier circuit 21) is supplied to the gate terminals of the transistors T34, T35 in the load circuit 22 by way of the condensers C1, C2, so that the load circuit 22 is configured to amplify the input signal of the differential amplifier circuit 21 in the full load where the transistors T34, T35 are set to be the current source type load.

Further, the output signal of the differential amplifier device 16 (differential amplifier circuit 21) is supplied to the gate terminals of the transistors T34, T35 in the load circuit 22 by way of the condensers C3, C4, and is performed a positive feedback, so that the load circuit 22 is configured to amplify the output signal of the differential amplifier circuit 21 in the full load where the transistors T34, T35 are set to be the current source type load.

Whereby, the differential amplifier device 16 in the subsequent stage is able to extremely increase the gain in the full load where the switching transistors T36, T37 are set to be off state in comparison with a conventional circuit, and accordingly, is able to increase the gain of the differential amplifier circuit 21 in the full load.

Then, the operation of the 2-stage amplifier device 17 is described.

The 2-stage amplifier device 17 repeats alternatively a reset mode where an analog signal voltage is supplied to the non-inverting input 19 and the inverting input 20 of the differential amplifier device 15 in the previous stage by setting the switch SW9 to be off state and the switch SW10 to be on state by the clock signal CLK and a comparison mode where the analog signal voltage is supplied to the non-inverting input 19 of the differential amplifier device 15 and a reference voltage is supplied to the inverting input 20 by setting the switch SW9 to be on state and the switch SW10 to be off state by the clock signal CLK.

And in the reset mode, the load of the differential amplifier device 16 in the subsequent stage is set to be a diode-type load by setting the load switching circuit 23 (switching transistor T36, T37) to be on state, so that the gain of the differential amplifier device 16 in the in the subsequent stage is decreased. On the contrary, in the comparison mode, the load of the differential amplifier device 16 in the subsequent stage is set to be a current source type load by setting the load switching circuit 23 (switching transistors T36, T37) to be off state, so that the gain of the differential amplifier device 16 in the in the subsequent stage is increased. Namely, in the 2-stage amplifier device 17, the gain of the differential amplifier device 16 in the subsequent stage in the comparison mode is set to be larger than in the reset mode.

As described above, the 2-stage amplifier device 17 apparently compresses an offset voltage of the differential amplifier device 15 in the previous stage by increasing or decreasing the gain of the differential amplifier device 16 in the subsequent stage.

That is, provided that the offset voltage of the differential amplifier device 15 in the previous stage is Vos, the gain in the reset mode (in the diode-type load) is Gr, the gain in the comparison mode (in the current source type load) is Gc, the output voltage is Vout, and the input voltage in the comparison mode is Vin, then, the output voltage Vout in the reset mode becomes Vout=Gr×Vos, and on the contrary, the output voltage Vout in the comparison mode becomes Vout=Gc×Vin, then equations Gr×Vos=Gc×Vinn, and further Vin=Vos×Gr/Gc are established.

As described above, in the 2-stage amplifier device 17 employing the differential amplifier device 16 of the above-mentioned configuration, the offset voltage is compressed by Gr/Gc, and the input conversion offset is to be designated as Vos×Gr/Gc.

First, Next, an effect of the condensers C1, C2 in the differential amplifier device 16 is described hereinafter.

In this case, a trans-conductance of the transistors T32, T33 configuring the differential amplifier device 16 is defined as gm1, a trans-conductance of the transistors T34, T35 configuring the load circuit 22 is defined as gm2, the load capacitance is C, and the comparing time is t, then the gain Gr in the reset mode is designated as Gr=gm1/gm2 like conventional circuit, but during the time when the comparing time t is short, the gain Gc in the full load is designated as Gr=gm1/gm2 different from the conventional circuit, so that the input conversion offset is to be designated as Vin=Vos×C/((gm2+gm2$^2$/gm1)×t).

In the past, the input conversion offset is used to be designated as Vin=Vos×C/(gm2×t), the effect of offset compression is to be increased with the condensers C1, C2 by gm2$^2$/gm1 of the denominator.

Next, an effect of the condensers C3, C4 in the differential amplifier device 16 is described hereinafter.

These condensers C3, C4 are connected between the gate terminals of the transistors T34, T35 and the output of the differential amplifier device 16.

Accordingly, a positive feedback signal to a gate potential of the transistors T34, T35 is to be inputted by way of these condensers C3, C4.

As the result, an additional gain A1 by the positive feedback is generated with these condensers C3, C4, and an input conversion offset of the differential amplifier device 16 is to be compressed to Gr/A1.

Thus, in the input conversion offset of the differential amplifier device 16, the compression effect increases by gm2$^2$/gm1 with the condensers C1, C2.

In addition, the compression by the condensers C3, C4 depends on a positive feedback, so that the compression effect becomes remarkable.

In this case, it is possible to increase the stability of the differential amplifier device 16 by changing the size ratio of the condensers C1, C2 and the condensers C3, C4.

That is, by adjusting energy ratios of the signal inputted through the condensers C1, C2 and the output signal of the differential amplifier device 16 to which the signal is inputted through the condensers C3, C4 through the change of the size ratio of the condensers C1, C2 and condensers C3, C4, it is possible to operate the differential amplifier device more stably and in high speed.

Figure 6:
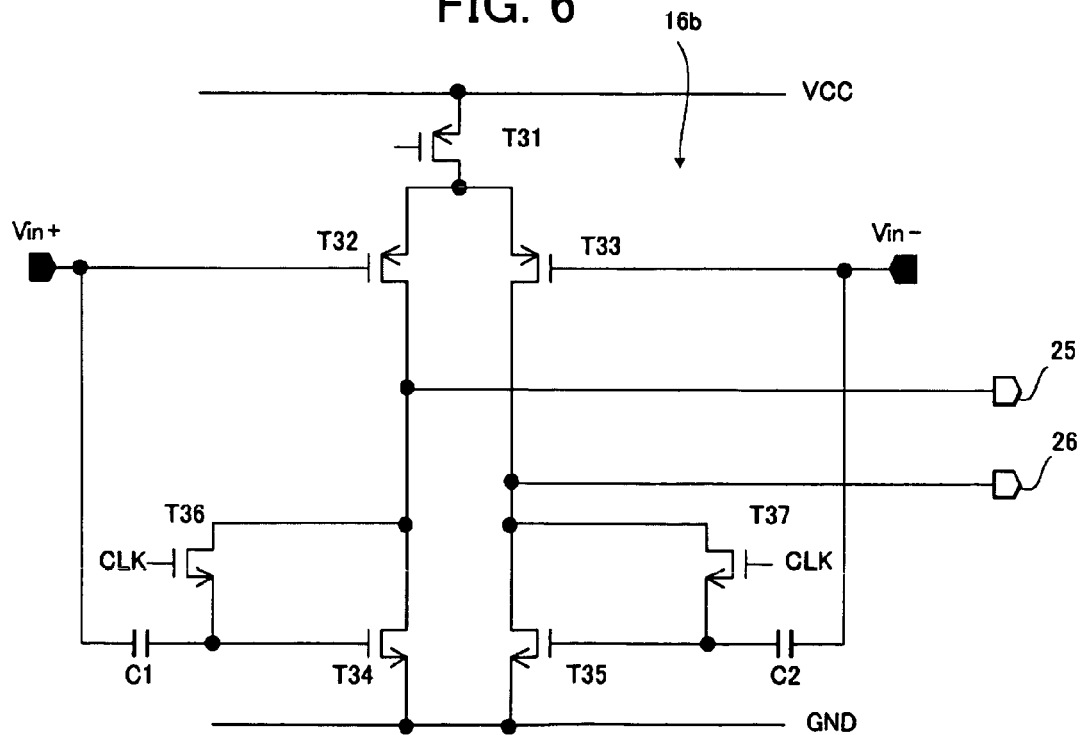
FIG. 6 is a circuit diagram of another differential amplifier circuit.

In addition, in the differential amplifier device 16, the effect of offset compression may be increased by employing only condensers C1, C2 without employing the condensers C3, C4 as shown in FIG. 6, or by employing only condensers C3, C4 without employing the condensers C1, C2 as shown in FIG. 7.

Figure 15:
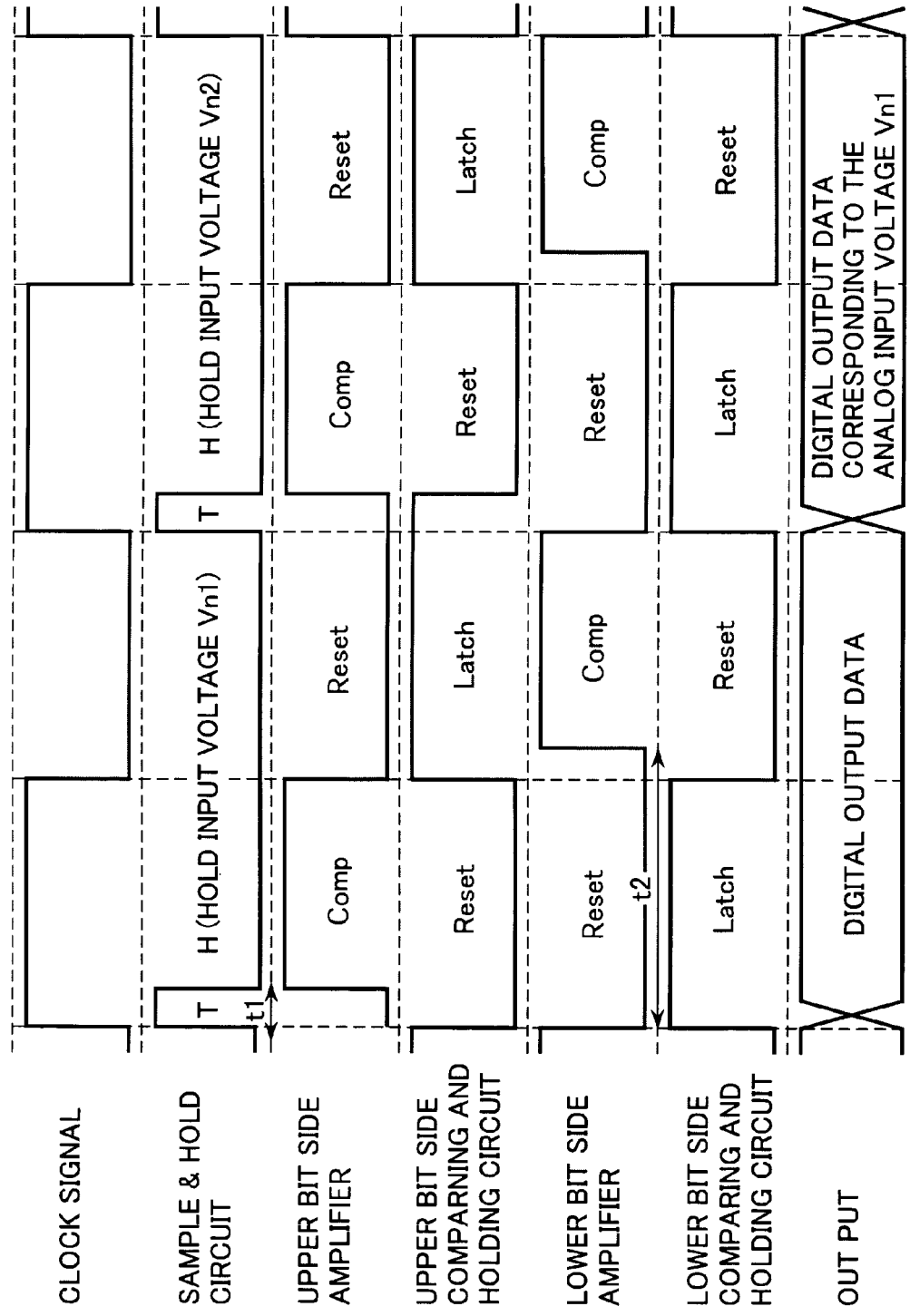
FIG. 15 is a timing chart for describing the operation of the analog/digital converter device.
Figure 16:
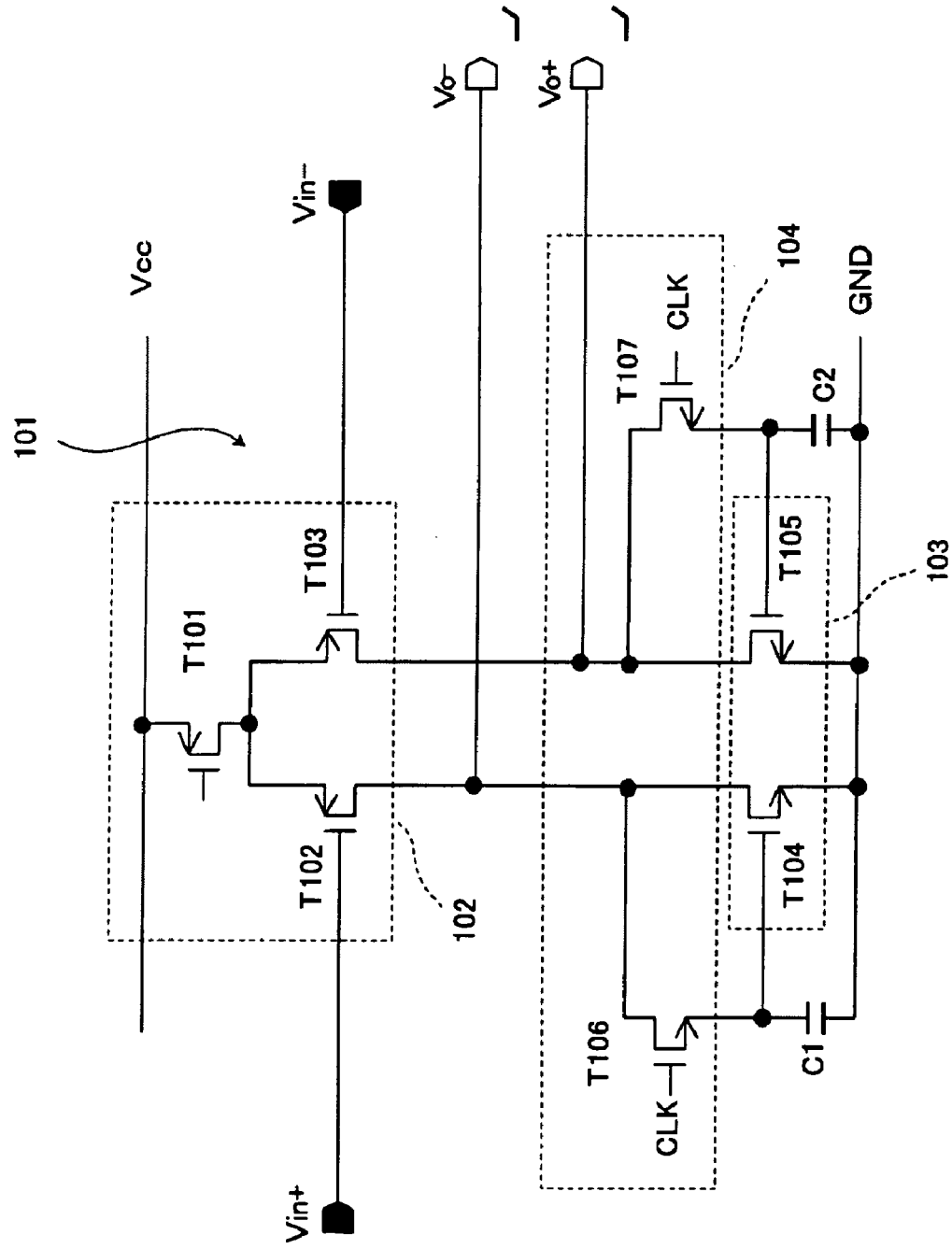
FIG. 16 is a circuit diagram of a conventional differential amplifier circuit.

Then, the operation of the analog/digital converter device 1 is described with reference to FIG. 15.

The analog/digital converter device 1 is configured to operate in synchronism with a clock signal CLK.

In this case, the sample and hold circuit 2 samples (tracks) the analog signal for a predetermined duration (T) in synchronism with the rising timing of the clock signal CLK, and after that, holds the sampled analog signal for a predetermined duration (H) until the next clock signal CLK rises.

The upper bit side amplifier circuit 13 is changed over from the reset mode to the comparison mode after a predetermined time (t1) from rising timing of the clock signal CLK, amplifies the voltage difference of the voltage of the analog signal held in the sample and hold circuit 2 and the reference voltage, and is again changed over from the comparison mode to the reset mode in synchronism with the falling timing of the clock signal CLK.

Further, the upper bit side comparing and holding circuit 14 is reset in synchronism with the rising timing of the clock signal CLK, and holds the output of the amplifier circuit 13 in synchronism with the falling timing of the clock signal CLK.

The upper bit side digital signal is then generated in the logic processing circuit 5 by logically processing the output held by the upper bit side comparing and holding circuit 14, and the upper bit side reference voltage is generated in the reference voltage generating circuit 3.

On the contrary, the upper bit side amplifier circuit 13 is changed from the reset mode to the comparison mode after a predetermined time (t2) from rising timing of the clock signal CLK, amplifies the voltage difference of the voltage of the analog signal held in the sample and hold circuit 2 and the reference voltage, and is again changed over from the comparison mode to the reset mode in synchronism with the rising timing of the clock signal CLK.

In addition, the upper bit side comparing and holding circuit 14 is reset in synchronism with the falling timing of the clock signal CLK, and holds the output of the amplifier circuit 13 in synchronism with the rising timing of the clock signal CLK.

The lower bit side digital signal is then generated in the logic processing circuit 5 by logically processing the output held by the upper bit side comparing and holding circuit 14, and the digital signal corresponding to the analog signal is outputted from the logic processing circuit 5 after one clock of the clock signal CLK in the reference voltage generating circuit 3.

In this case, in the above-mentioned analog/digital converter device 1, the amplifier circuit as depicted in FIG. 5 is employed as the differential amplifier device 16 applied in the subsequent stage of the 2-stage amplifier device 17, but it is not limited to this, and amplifier circuits as depicted in FIG. 8 to FIG. 11 may be employed. In these figures FIG. 8 to FIG. 11, one having the same function in the circuit in FIG. 5 is given the same reference code.

A differential amplifier device 16c shown in FIG. 8 employs cascade-connected transistors T32, T40, T33, T41 as the differential amplifier circuit 21, and employs cascade-connected transistors T38, T34, T39, T35 as the load circuit 22. A predetermined bias voltage is applied to gate terminals of the transistors T38, T39, T40, T41.

A differential amplifier device 16d shown in FIG. 9 employs cascade-connected transistors T38, T34, T39, T35 as the load circuit 22, and condensers C5, C6 for holding voltage are connected between gate terminals of the transistors T34, T35 and the ground GND. A predetermined bias voltage is applied to gate terminals of the transistors T38, T39.

Thus, it is possible to more stabilize the operation point in the comparison mode by connecting condensers C5, C6.

A differential amplifier device 16e shown in FIG. 10 employs amplifier devices AMP1, AMP2 for amplifying the output signal of the differential amplifier circuit 21 connected between condensers C3, C4 and output of the differential amplifier circuit 21. In this case, buffer circuits may be employed instead of the amplifier devices AMP1, AMP2.

In the above-mentioned analog/digital converter device 1, the differential amplifier device 16b not requiring the condensers C3, C4 is depicted as shown in FIG. 6, but it is not limited to this, and circuits as depicted in FIG. 11 to FIG. 14 may be employed. In this case, in FIG. 11 to FIG. 14, the same reference codes are assigned to the circuit having the same function as the circuit in FIG. 6.

Figure 11:
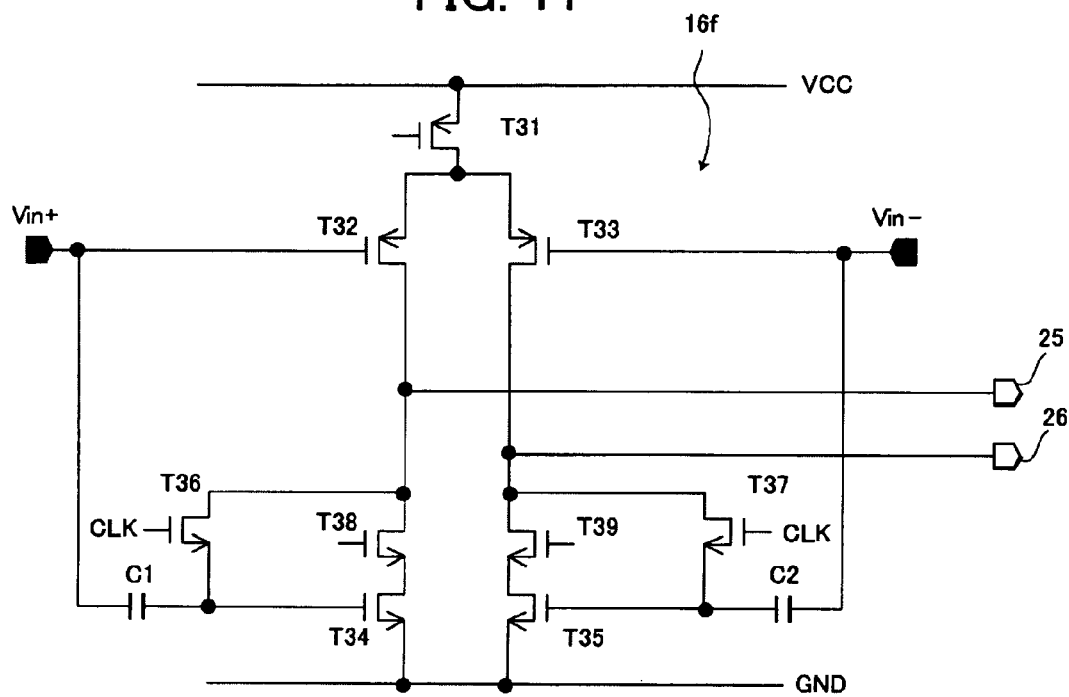
FIG. 11 is a circuit diagram of another differential amplifier circuit.

A differential amplifier device 16f shown in FIG. 11 employs cascade-connected transistors T38, T34, T39, T35 as the load circuit 22. A predetermined bias voltage is applied to gate terminals of the transistors T38, T39.

Figure 12:
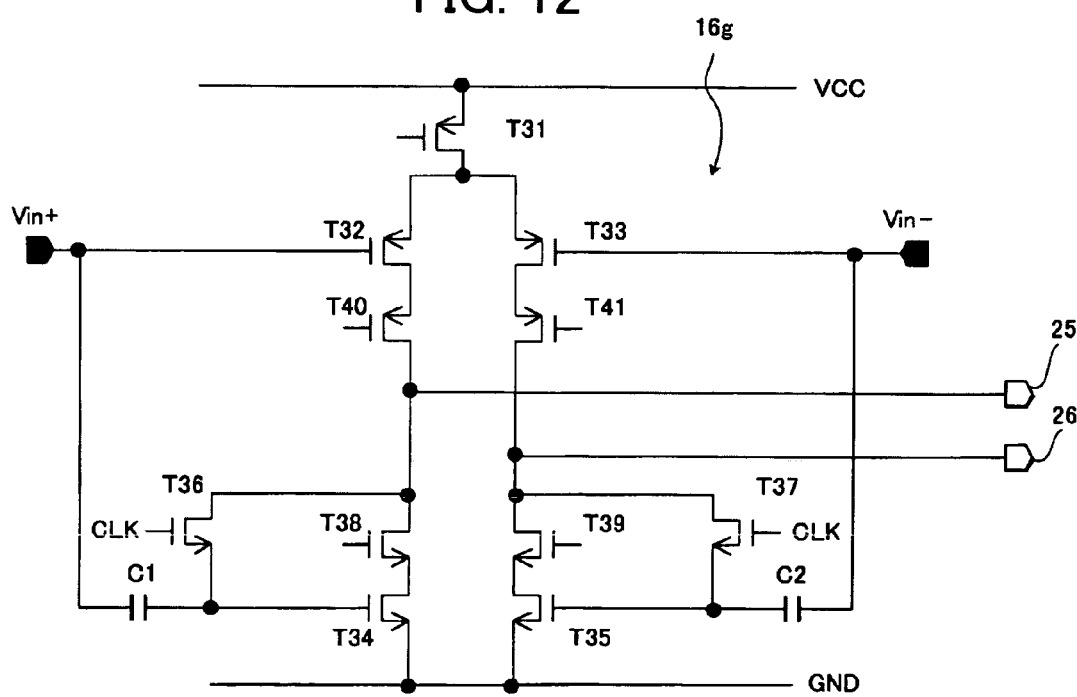
FIG. 12 is a circuit diagram of another differential amplifier circuit.

A differential amplifier device 16g shown in FIG. 12 employs cascade-connected transistors T32, T40, T33, T41 as the differential amplifier circuit 21, and employs cascade-connected transistors T38, T34, T39, T35 as the load circuit 22. A predetermined bias voltage is applied to gate terminals of the transistors T38, T39, T40, T41.

Figure 13:
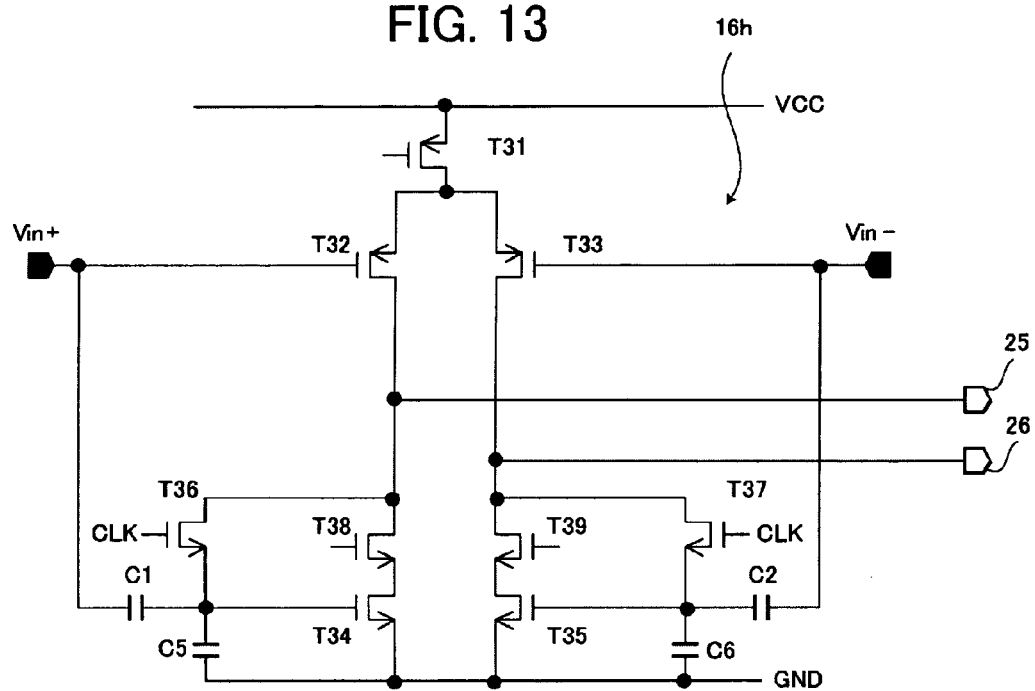
FIG. 13 is a circuit diagram of another differential amplifier circuit.

A differential amplifier device 16h shown in FIG. 13 employs cascade-connected transistors T38, T34, T39, T35 as the load circuit 22, and condensers C5, C6 for holding voltage are connected between the gate terminals of the transistors T34, T35 and the ground GND. A predetermined bias voltage is applied to the gate terminals of the transistors T38, T39.

Thus, by connecting the condensers C5, C6, it is possible to more stabilize the operation point at the comparison mode.

Figure 14:
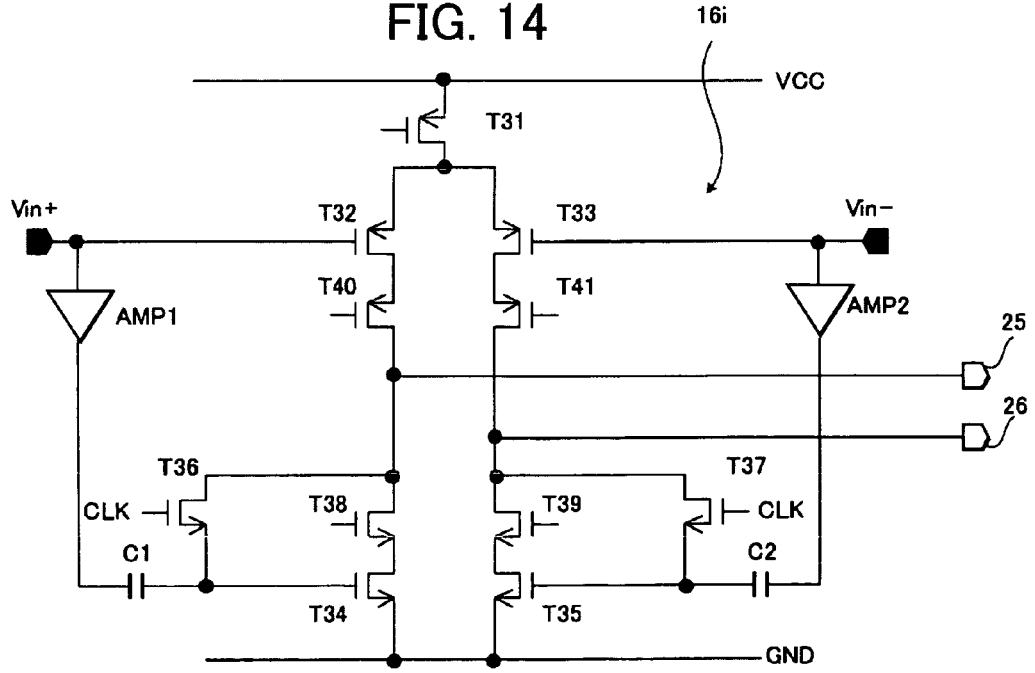
FIG. 14 is a circuit diagram of another differential amplifier circuit.

A differential amplifier device 16i shown in FIG. 14 employs cascade-connected transistors T32, T40, T33, T41 as the differential amplifier circuit 21, employs cascade-connected transistors T38, T34, T39, T35 as the load circuit 22, and includes amplifier devices AMP1, AMP2 for amplifying the input signal, between the condensers C1, C2 and the input terminal. A predetermined bias voltage is applied to gate terminals of the transistors T38, T39, T40, T41. In this case, buffer circuits may be employed instead of the amplifier devices AMP1, AMP2.

In this case, in the above embodiment, a 4-bit sub-ranging type analog/digital converter device which performs the conversion by 2 times by 2 bits each time is described as one example, but not limited to this, and the one configured to perform conversion with plural steps may be used, and further, it in not limited to a single input type, but a differential input type may be employed. Further, with regard to a specific circuit, it is not limited to a circuit which only requires a positive power source, but a circuit which requires both positive and negative power sources, and further, may require only an negative power source. Further, specific circuit elements configuring the circuit may be freely selected.

What is claimed is:

1. A differential amplifier device comprising:
   a differential amplifier circuit;
   a load circuit connected to the differential amplifier circuit; and
   a change-over switch connected to the load circuit for changing a gain of the differential amplifier circuit by switching between a full load where a whole of the load circuit is set to be the load of the differential amplifier circuit and a partial load where a part of the load circuit is set to be the load of the differential amplifier circuit, wherein
   the load circuit is configured to amplify an input signal and an output signal of the differential amplifier circuit in the full load.

2. The differential amplifier device as cited in claim 1, wherein
   the full load is configured with a current source-type load, and the partial load is configured with a diode-type load.

3. The differential amplifier device as cited in claim 1 or 2, wherein
   the output signal of the differential amplifier circuit is inputted to the load circuit by way of a condenser.

4. The differential amplifier device as cited in claim 1 or 2, wherein
   the input signal of the differential amplifier circuit is inputted to the load circuit by way of a condenser.

5. A 2-stage amplifier device in which at least 2 differential amplifier devices are connected in series, and an offset compression function is given by increasing/decreasing the gain of the differential amplifier device in a subsequent stage, wherein
   the differential amplifier device in the subsequent stage is configured to comprise:
   a differential amplifier circuit;
   a load circuit connected to the differential amplifier circuit; and
   a change-over switch connected to the load circuit for changing a gain of the differential amplifier circuit by switching between a full load where a whole of the load circuit is set to be the load of the differential amplifier circuit and a partial load where a part of the load circuit is set to be the load of the differential amplifier circuit, and
   the load circuit is configured to amplify an input signal and an output signal of the differential amplifier circuit.

6. The 2-stage amplifier device as cited in claim 5, wherein
   the full load is configured with a current source-type load, and the partial load is configured with a diode-type load.

7. The 2-stage amplifier device as cited in claim 5 or 6, wherein
   the output signal of the differential amplifier circuit is inputted to the load circuit by way of a condenser.

8. The 2-stage amplifier device as cited in claim 5 or 6, wherein
   the input signal of the differential amplifier circuit is inputted to the load circuit by way of a condenser.

9. An analog/digital converter device configured to amplify differences between an analog signal voltage and a plurality of reference voltages in a plurality of amplifying sections to convert into a digital signal, wherein
   each of amplifying sections is configured with a differential amplifier device having an offset compressing function for compressing an offset voltage,
   the differential amplifier device is configured to connect a load circuit to the differential amplifier circuit, a change-over switch is connected to the load circuit, and a gain of the differential amplifier circuit is changed with this change-over switch by switching between a full load where a whole of the load circuit is set to be the load of the differential amplifier circuit and a partial load where a part of the load circuit is set to be the load of the differential amplifier circuit, and
   the load circuit is configured to amplify the input signal and the output signal of the differential amplifier circuit in the full load.

10. The analog/digital converter device as cited in claim 9, wherein
the full load is configured with a current source-type load, and the partial load is configured with a diode-type load.

11. The analog/digital converter device as cited in claim 9 or 10, wherein
the output signal of the differential amplifier circuit is inputted to the load circuit by way of a condenser.

12. The analog/digital converter device as cited in claim 9 or 10, wherein
the input signal of the differential amplifier circuit is inputted to the load circuit by way of a condenser.

13. An analog/digital converter device configured to amplify differences between an analog signal voltage and a plurality of reference voltages in a plurality of amplifying sections to convert into a digital signal, wherein
each of amplifying sections is configured with a differential amplifier device having an offset compressing function for compressing an offset voltage, a load circuit is connected to the differential amplifier circuit, and a change-over switch is connected to the load circuit, and a gain of the differential amplifier circuit is changed with this change-over switch by switching between a comparison mode where a whole of the load circuit is set to be the load of the differential amplifier circuit and a reset mode where a part of the load circuit is set to be the load of the differential amplifier circuit, and
the load circuit is configured to amplify the input signal and the output signal of the differential amplifier circuit in the full load.

14. The analog/digital converter device as cited in claim 13, wherein
the full load is configured with a current source-type load, and the partial load is configured with a diode-type load.

15. The analog/digital converter device as cited in claim 13 or 14, wherein
the output signal of the differential amplifier circuit is inputted to the load circuit by way of a condenser.

16. The analog/digital converter device as cited in claim 13 or 14, wherein
the input signal of the differential amplifier circuit is inputted to the load circuit by way of a condenser.

* * * * *